United States Patent
Yang et al.

(10) Patent No.: US 10,910,228 B2
(45) Date of Patent: *Feb. 2, 2021

(54) SURFACE TREATMENT OF CARBON CONTAINING FILMS USING ORGANIC RADICALS

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Hua Chung, Saratoga, CA (US); Xinliang Lu, Fremont, CA (US)

(73) Assignees: Mattson Technolgoy, Inc., Freemont, CA (US); Beijing E-Town Semiconductor Technology Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/357,800

(22) Filed: Mar. 19, 2019

(65) Prior Publication Data
US 2019/0214262 A1 Jul. 11, 2019

Related U.S. Application Data

(63) Continuation of application No. 15/958,601, filed on Apr. 20, 2018, now Pat. No. 10,269,574.
(Continued)

(51) Int. Cl.
*H01L 21/768* (2006.01)
*H01L 21/3213* (2006.01)
(Continued)

(52) U.S. Cl.
CPC ........ *H01L 21/3003* (2013.01); *B01D 67/009* (2013.01); *C23C 16/452* (2013.01);
(Continued)

(58) Field of Classification Search
None
See application file for complete search history.

(56) References Cited

U.S. PATENT DOCUMENTS 4,885,067 A 12/1989 Doty
5,275,798 A 1/1994 Aida
(Continued)

FOREIGN PATENT DOCUMENTS

KR 10-0777043 11/2007
KR 10-2013-0056595 5/2013
(Continued)

OTHER PUBLICATIONS

PCT International Search Report and Written Opinion for corresponding PCT Application No. PCT/US2018/051706, dated Jan. 10, 2019—13 pages.
(Continued)

*Primary Examiner* — Stephanie P Duclair
(74) *Attorney, Agent, or Firm* — Dority & Manning, P.A.

(57) ABSTRACT

Surface treatment processes for treating a workpiece with organic radicals are provided. In one example implementation, a method for processing a workpiece having a semiconductor material and a carbon containing layer (e.g., photoresist) can include a surface treatment process on the workpiece. The surface treatment process can include generating one or more species in a first chamber (e.g., a plasma chamber). The surface treatment process can include mixing one or more hydrocarbon radicals with the species to create a mixture. The surface treatment process can include exposing the carbon containing layer to the mixture in a second chamber (e.g., a processing chamber).

17 Claims, 9 Drawing Sheets

Related U.S. Application Data

(60) Provisional application No. 62/567,295, filed on Oct. 3, 2017.

(51) Int. Cl.

| | | |
|---|---|---|
| *H01L 21/321* | (2006.01) | |
| *H01L 21/311* | (2006.01) | |
| *H01L 21/3105* | (2006.01) | |
| *H01L 21/306* | (2006.01) | |
| *H01L 21/302* | (2006.01) | |
| *H01L 21/30* | (2006.01) | |
| *H01L 21/027* | (2006.01) | |
| *H01L 21/02* | (2006.01) | |
| *H01J 37/32* | (2006.01) | |
| *C23F 4/00* | (2006.01) | |
| *C23F 1/12* | (2006.01) | |
| *C23C 16/452* | (2006.01) | |
| *B01D 67/00* | (2006.01) | |

(52) U.S. Cl.
CPC .......... *C23F 1/12* (2013.01); *H01J 37/32743* (2013.01); *H01J 37/32899* (2013.01); *H01L 21/0234* (2013.01); *H01L 21/0271* (2013.01); *H01L 21/02118* (2013.01); *H01L 21/02252* (2013.01); *H01L 21/02321* (2013.01); *H01L 21/302* (2013.01); *H01L 21/306* (2013.01); *H01L 21/3105* (2013.01); *H01L 21/31058* (2013.01); *H01L 21/31138* (2013.01); *H01L 21/321* (2013.01); *H01L 21/32136* (2013.01); *H01L 21/76826* (2013.01); *C23F 4/00* (2013.01); *H01J 37/321* (2013.01); *H01J 2237/006* (2013.01); *H01J 2237/332* (2013.01)

(56) References Cited

U.S. PATENT DOCUMENTS

| | | | |
|---|---|---|---|
| 5,811,022 | A | 9/1998 | Savas et al. |
| 6,028,015 | A | 2/2000 | Wang |
| 6,107,197 | A * | 8/2000 | Suzuki .............. H01L 21/02046 |
| | | | 117/90 |
| 7,541,200 | B1 | 6/2009 | Schravendijk et al. |
| 7,604,708 | B2 | 10/2009 | Wood et al. |
| 7,807,579 | B2 * | 10/2010 | Yang ................. H01L 21/02063 |
| | | | 216/63 |
| 8,821,987 | B2 | 9/2014 | Shanker |
| 9,214,319 | B2 | 12/2015 | Nagorny et al. |
| 9,837,270 | B1 | 12/2017 | Varadarajan et al. |
| 2003/0042465 | A1 | 3/2003 | Ko |
| 2003/0134051 | A1 | 7/2003 | Jung et al. |
| 2004/0154743 | A1 * | 8/2004 | Savas ...................... G03F 7/427 |
| | | | 156/345.5 |
| 2006/0081273 | A1 | 4/2006 | McDermott |
| 2008/0261405 | A1 | 10/2008 | Yang |
| 2009/0050271 | A1 | 2/2009 | Goyal |
| 2009/0274610 | A1 | 11/2009 | Ghoanneviss et al. |
| 2011/0117751 | A1 | 5/2011 | Sonthalia |
| 2012/0285481 | A1 | 11/2012 | Lee et al. |
| 2013/0034968 | A1 * | 2/2013 | Zhang ............... H01L 21/31116 |
| | | | 438/718 |
| 2014/0113532 | A1 | 4/2014 | Smith |
| 2014/0261186 | A1 | 9/2014 | Cho |
| 2015/0108493 | A1 | 4/2015 | Kang |
| 2015/0126027 | A1 | 5/2015 | Matsumoto |
| 2015/0239759 | A1 | 8/2015 | Kang |
| 2015/0303065 | A1 | 10/2015 | Buckalew |
| 2016/0020089 | A1 | 1/2016 | Thadani |
| 2016/0079062 | A1 | 3/2016 | Zheng et al. |
| 2016/0260616 | A1 * | 9/2016 | Li ........................ H01L 21/3065 |
| 2016/0276134 | A1 | 9/2016 | Collins |
| 2017/0029950 | A1 | 2/2017 | Chen |

FOREIGN PATENT DOCUMENTS

| | | |
|---|---|---|
| WO | WO 2010-045153 | 4/2010 |
| WO | WO 2017/147365 | 8/2017 |

OTHER PUBLICATIONS

J. Bao et al., Mechanistic Study of Plasma. Damage and $CH_4$ Recovery of Low k Dielectric Surface, International Interconnect Technology Conference, IEEE 2007, 147-149.

HMDS (available online) Retrieved from the internet May 17, 2018, https://www.microchemicals.com/products/adhesion_promotion/hmds.html—2 pages.

Michael X. Yang et al., U.S. Appl. No. 15/958,560, filed Apr. 20, 2018, Surface Treatment of Silicon or Silicon Germanium Surfaces Using Organic Radicals.

Michael X. Yang et al., U.S. Appl. No. 15/958,635, filed Apr. 20, 2018, Surface Treatment of Silicon and Carbon Containing Films by Remote Plasma With Organic Precursors.

Michael X. Yang et al., U.S. Appl. No. 15/958,601, filed Apr. 20, 2018, Surface Treatment of Carbon Containing Films Using Organic Radicals.

PCT International Preliminary Report on Patentability for corresponding PCT Application No. PCT/US2018/051706, dated Apr. 8, 2020, 9 pages.

* cited by examiner

SURFACE TREATMENT OF CARBON CONTAINING FILMS USING ORGANIC RADICALS

PRIORITY CLAIM

The present application is a continuation of U.S. application Ser. No. 15/958,601, titled "Surface Treatment of Carbon Containing Films Using Organic Radicals," filed Apr. 20, 2018, which claims the benefit of priority of U.S. Provisional Application Ser. No. 62/567,295, titled "Surface Treatment of Silicon and Carbon Containing Films by Remote Plasma with Organic Precursors," filed Oct. 3, 2017, which is incorporated herein by reference for all purposes.

FIELD

The present disclosure relates generally to surface treatment of a workpiece using organic radicals.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Post-implantation photoresist, post-etch residue, and other mask and/or material removal have been accomplished using plasma dry strip processes. In plasma dry strip processes, neutral particles from a plasma generated in a remote plasma chamber pass through a separation grid into a processing chamber to treat a substrate, such as a semiconductor wafer.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece can include a semiconductor material and a carbon containing layer. The method can include a surface treatment process on the workpiece. The surface treatment process can include generating one or more species in a first chamber. The surface treatment process can include mixing one or more hydrocarbon radicals with the species to create a mixture. The surface treatment process can include exposing the carbon containing layer to the mixture in a second chamber.

Other example aspects of the present disclosure are directed to systems, methods, and apparatus for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
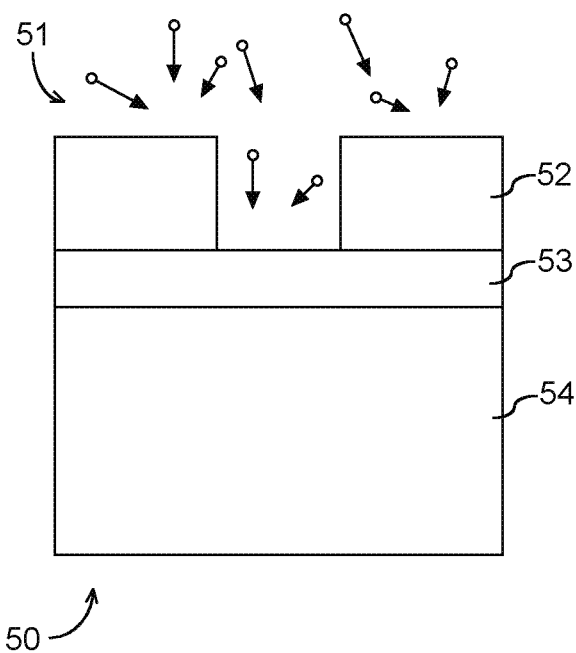
FIG. 1 depicts an example workpiece structure having a carbon containing layer.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment processes for treating a workpiece, such as a semiconductor wafer. The workpiece can include a semiconductor material (e.g., silicon (Si) or Silicon Germanium (SiGe)) and a carbon containing layer, such as a photoresist layer. Dry strip processes can be performed to treat a workpiece during semiconductor processing. For instance, dry strip processes can be used for photoresist removal, chemical residue removal, or other material removal.

In some example dry strip processes, a workpiece can be placed on a pedestal or other substrate in a processing chamber. A plasma can be induced (e.g., using an inductively coupled plasma source) in a remote plasma chamber to generate species (e.g., ions and neutrals) in a process gas or other mixture. A separation grid separating the plasma chamber from the processing chamber can filter ions and allow passage of the neutrals through holes in the separation grid to the processing chamber. The neutrals can be exposed to the surface of the workpiece to remove material from the workpiece (e.g., photoresist, residue, etc.).

During the dry strip process, several requirements may need to be satisfied including, for instance, a high photoresist strip rate, a high material-etch selectivity of the photoresist materials being removed relative to the underlying material, the prevention of oxidation of the underlying materials such as silicon and silicon germanium, and critical dimension (CD) control.

FIG. 1 depicts an example workpiece 50 having a semiconductor material and a carbon-containing layer. More particularly, a workpiece can include a substrate 54 with a semiconductor layer 53 and one or more carbon containing layers 52. The substrate 54 can be, for instance, a Si substrate. The semiconductor layer 53 can be, for instance, a Si thin film and/or a SiGe thin film. The carbon containing layer 52 can be a photoresist or other suitable carbon containing layer. The carbon-containing layer can include, for instance, one or more polymers.

In general, photoresists can be classified into three groups: photopolymeric, photocrosslinking and photodecomposing materials. Photopolymeric materials can generate free radicals to initiate polymerization of monomers upon light exposure. Photocrosslinking materials can crosslink between polymer chains to form an insoluble network upon light exposure. Both photopolymeric and photocrosslinking materials can serve as negative photoresists, i.e. exposed region becomes insoluble in the developer. By contrast, photodecomposing materials can decompose and generate hydrophilic products under light exposure. They can serve as positive photoresists, i.e. exposed region is soluble in aqueous developer. For example, one very common positive photoresist is based on a mixture of diazonaphthoquinone (DNQ) and novolac resin (a phenol formaldehyde resin).

During a dry strip process, neutral radicals 51 passing through a separation grid can be used to remove the carbon-containing layer 52 (and other surface residues). In some applications, it may be desirable to modify the carbon containing layer prior to and/or during a strip process to affect various process parameters, such as selectivity of photoresist removal and critical dimension control.

According to example aspects of the present disclosure, an organic radical based surface treatment process can be performed in conjunction with a dry strip process and/or as a separate step from the dry strip process to modify characteristics of a carbon containing layer (e.g., photoresist or other carbon containing layer) using an organic radical based surface treatment process. More particularly, the organic radical based surface treatment process can expose a semiconductor surface (e.g., a silicon and/or silicon germanium) to neutral organic radicals ($CH_3$) radicals. The organic radicals can modify various properties of the carbon containing layer (e.g., by methylation of at least a portion of the carbon containing layer). In this manner, properties of the carbon containing layer (e.g., photoresist or other carbon containing layer) can be modified as a process parameter during, for instance, a dry strip process.

In some embodiments, the organic radical based surface treatment process can include generating one or more species (e.g., hydrogen radicals and/or excited inert gas molecules) in a plasma chamber that is separated from the processing chamber by a separation grid. The species can be generated, for instance, by inducing a plasma in a process gas. In some embodiments, the process gas can be an inert gas, such as helium (He), argon (Ar), or xenon (Xe). In some embodiments, the process gas, for instance, can be a mixture including $H_2$ and nitrogen ($N_2$) or can be a mixture including $H_2$ and He or can be a mixture including $H_2$ and Ar. In some other embodiments, the species can include one or more hydrogen radicals generated, for instance, using a heated filament, such as a heated tungsten filament.

The organic radical based surface treatment process can include filtering ions while allowing the passage of neutrals in the mixture to generate a filtered mixture with neutrals for exposure to the workpiece. For instance, a separation grid can be used to filter ions generated in the plasma chamber and allow passage of neutrals through holes in the separation grid to the processing chamber for exposure to the workpiece.

In some embodiments, the neutrals can include one or more organic radicals, such as methyl ($CH_3$) radicals. The organic radicals can attach on the surface of the carbon containing layer to modify one or more properties of the carbon containing layer (e.g., via methylation). The organic radicals can be mixed with other gases and radicals, such as hydrogen.

In some embodiments, the organic radicals (e.g., $CH_3$ radicals) can be generated by dissociating one or more hydrocarbon molecules in the plasma chamber. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

In some embodiments, the organic radicals (e.g., $CH_3$ radicals) can be generated by injecting a gas into post plasma mixtures. For instance, a plasma (e.g., $H_2$ plasma or inert gas plasma such as an He plasma) can be generated in a remote plasma chamber. The mixture can pass through a separation grid assembly for ion filtering. Post ion filtering, a hydrocarbon ($CH_4$, etc.) can be injected into the filtered mixture for generation of organic radicals (e.g., $CH_3$ radicals).

The organic radicals can be generated using other approaches. For instance, organic radicals can be generated using pyrolysis (thermal decomposition) of molecules (e.g., azomethane $CH_3-N=N-CH_3$) or UV-assisted molecule dissociation (e.g., acetone $CH_3COCH_3$).

The workpiece can be supported on a pedestal. The pedestal can include a temperature regulation system (e.g., one or more electrical heaters) used to control workpiece temperature during processing. In some embodiments, the organic radical based surface treatment process can be carried out with the workpiece at a temperature in the range of about 20° C. to about 500° C.

The organic radical based surface treatment process can be performed in conjunction with a dry strip process. For instance, in some embodiments, the organic radical based surface treatment process can be carried out in the same process step as a dry strip process. In this example embodiment, a plasma source (e.g., inductively coupled plasma source, capacitively coupled plasma source, etc.) can be used to generate one or more hydrogen radicals from a process gas in a plasma chamber. The process gas can include, for instance, a mixture including $H_2$ and $N_2$ and/or a mixture including $H_2$ and He and/or a mixture including $H_2$ and Ar. The plasma source can also be used to dissociate one or more hydrocarbon molecules to generate organic radicals (e.g., $CH_3$ radicals) as part of the same process step. The hydrogen radicals and organic radicals can pass through a separation grid to a processing chamber for exposure to the workpiece.

In some embodiments, the organic radical based surface treatment process can be performed as a separate step from the dry strip process. For instance, a method for processing a semiconductor substrate can include performing a dry strip process. During the dry strip process, a plasma source can be used to generate one or more radicals for conducting a dry strip process in a plasma chamber. The radicals can pass through a separation grid for exposure to the workpiece to carry out the dry strip process.

In a separate process step, one or more organic radicals (e.g., $CH_3$) radicals can be exposed to the workpiece as part of the organic radical based surface treatment process according to example embodiments of the present disclosure. The organic radical based surface treatment process can be performed prior to and/or after the dry strip process.

Certain workpiece layers can have low surface wetting angle associated with hydrophilic properties of the workpiece material. For instance, a workpiece may include one or more layers or structures of the following materials associated with a low surface wetting angle: Si, SiGe, silicon nitride (SiN), silicon dioxide ($SiO_2$), aluminum oxide ($Al_2O$), tantalum nitride (TaN), titanium nitride (TiN), tungsten (W), and/or copper (Cu). In some applications, it may be desirable to coat and/or deposit workpiece layers with a coating layer that favors high surface wetting angle/hydrophobic surfaces for adhesion, such as photoresist and/or an antireflective coating layer.

To facilitate adhesion of a coating layer to a hydrophilic layer, the surface wetting angle of the hydrophilic workpiece layer can be modified, for instance, using a primer such as Hexamethyldisilazane (HMDS). HMDS can chemically bond its Si atom to the oxygen of an oxidized surface. This can result in the release of ammonia ($NH_3$). Methyl groups of the HMDS can fragment and bond with the workpiece layer to form a hydrophobic surface.

The application of HMDS to prep a workpiece layer for deposit of, for instance, a photoresist layer can suffer several draw backs. For instance, application of HMDS can require increased process time, can be challenging for certain workpiece structures (e.g., high aspect ratio (HAR) structures), can present thermal stability issues, and can make it difficult to control surface coverage. Moreover, HMDS may not be suitable for certain workpiece layers, such as TiN layers.

According to example aspects of the present disclosure, the surface wetting angle of a workpiece layer can be modified using an organic radical surface treatment process according to example embodiments of the present disclosure. For instance, in some embodiments, an organic radical based surface treatment process can be inserted in the manufacturing flow prior to deposit of a carbon containing layer, such as photoresist, onto the workpiece.

The organic radical surface treatment process can expose hydrophilic workpiece layers to organic radicals (e.g., $CH_3$). The organic radicals (e.g., $CH_3$ organic radicals) can attach to the surface of the hydrophilic workpiece layers (e.g., through methylation), making the workpiece layers more hydrophobic to facilitate deposit of layers (e.g., carbon containing layers such as photoresist, antireflective coating layers, etc.) onto the workpiece.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

One example aspect of the present disclosure is directed to a method for processing a workpiece. The workpiece can include a semiconductor material and a carbon containing layer. The method can include a surface treatment process on the workpiece. The surface treatment process can include generating one or more species in a first chamber. The surface treatment process can include mixing one or more hydrocarbon radicals with the species to create a mixture. The surface treatment process can include exposing the carbon containing layer to the mixture in a second chamber.

In some embodiments, the one or more hydrocarbon molecules can have a chemical formula of $C_nH_{2n+2}$, where n is greater than or equal to 1 and less than or equal to 10. In some embodiments, the one or more hydrocarbon molecules have a chemical formula of $C_nH_{2n}$, where n is greater than or equal to 2 and n is less than or equal to 10.

In some embodiments, the one or more organic radicals are generated by dissociating one or more hydrocarbon molecules in the mixture in the first chamber. The first chamber can be separated from the second chamber with a separation grid. The hydrocarbon molecules can be mixed with the species in the second chamber. In some embodiments, the method can include filtering one or more ions to create a filtered mixture using a separation grid separating the first chamber from the second chamber.

In some embodiments, the mixture includes one or more organic radicals. In some embodiments, the mixture includes a $CH_3$ radical.

In some embodiments, the carbon containing layer includes photoresist. In some embodiments, the method includes performing a dry strip process to remove at least a portion of the carbon containing layer.

In some embodiments, the one or more species can be generated by a plasma induced in a process gas in the first chamber. In some embodiments, the process gas can be an inert gas, such as helium. In some embodiments, the process gas includes a hydrogen gas and the species includes hydrogen radicals.

In some embodiments, one or more organic radicals are generated in a plasma in the first chamber using an inductively coupled plasma source. In some embodiments, the one or more species comprise hydrogen radicals generated using a heated filament. In some embodiments, one or more organic radicals are generated using pyrolysis of molecules or UV-assisted molecule dissociation.

Another example embodiment of the present disclosure is directed to a method of processing a semiconductor workpiece, the method includes performing an organic radical based surface treatment process on a workpiece to modify a surface wetting angle of a workpiece layer (e.g., a hydrophilic workpiece layer) on the workpiece; and subsequent to performing the organic radical based surface treatment process, depositing a coating material on the workpiece layer. The organic radical based surface treatment process can include generating one or more species in a first chamber; mixing one or more hydrocarbon molecules with the species to create a mixture, the mixture comprising one or more organic radicals, and exposing the workpiece layer to the mixture in a second chamber.

In some embodiments, the workpiece layer is a hydrophilic workpiece layer. In some embodiments, the workpiece layer includes Si, SiGe, SiN, $SiO_2$, $Al_2O$, TaN, TiN, W, or Cu.

In some embodiments, the coating material includes photoresist. In some embodiments, the coating material includes an antireflective material.

In some embodiments, the one or more hydrocarbon molecules have a chemical formula of $C_nH_{2n+2}$, where n is greater than or equal to 1 and less than or equal to 10 or the one or more hydrocarbon molecules have a chemical formula of $CH_2n$, where n is greater than or equal to 2 and n is less than or equal to 10.

In some embodiments, the one or more species are generated by inducing a plasma in a process gas in the first chamber. The process gas can be an inert gas, such as helium.

Figure 2:
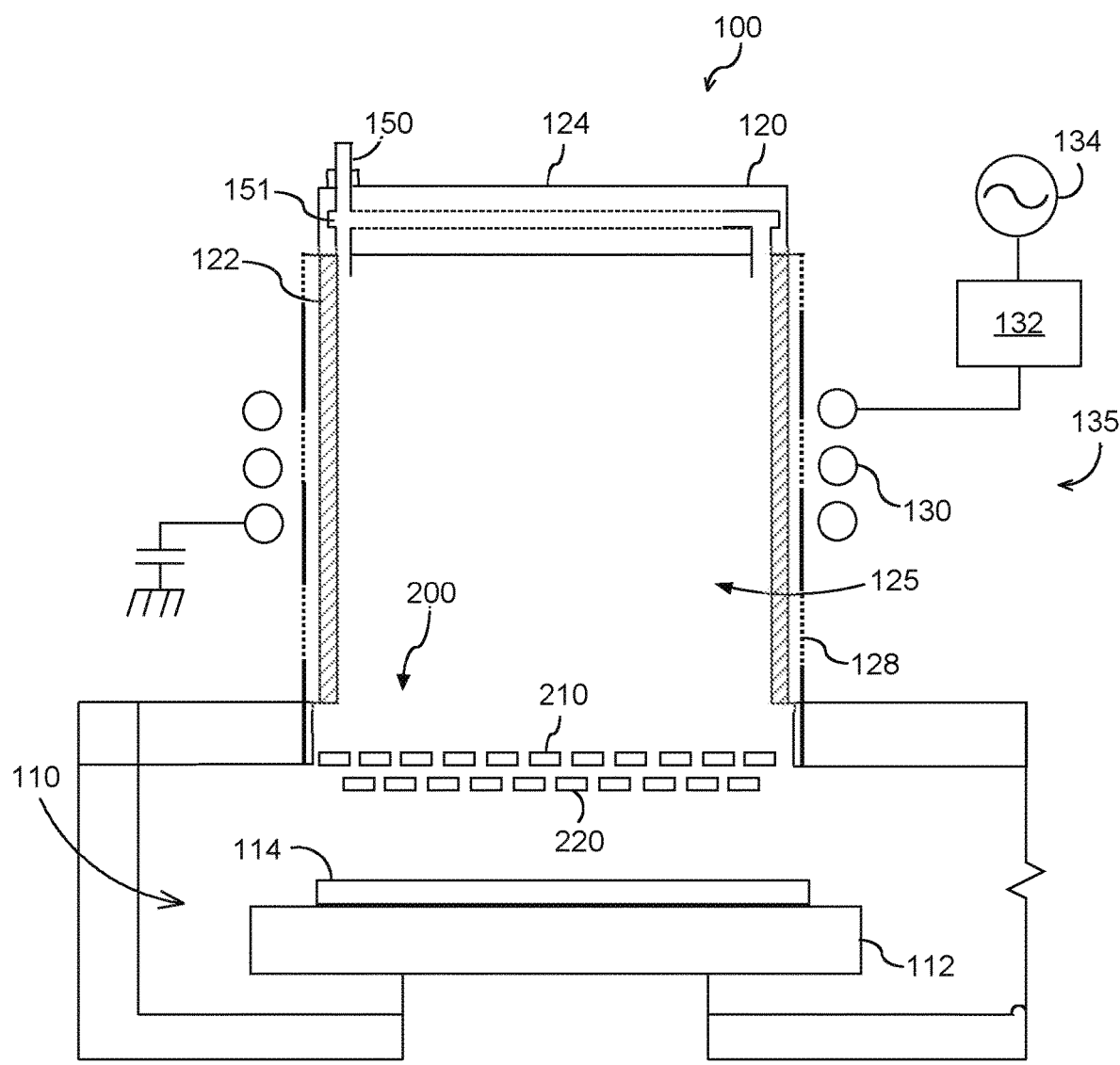
FIG. 2 depicts an example plasma processing apparatus according to example embodiments of the present disclosure.

FIG. 2 depicts an example plasma processing apparatus 100 that can be used to perform surface treatment processes according to example embodiments of the present disclosure. As illustrated, the plasma processing apparatus 100 includes a processing chamber 110 and a plasma chamber 120 that is separated from the processing chamber 110. The processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and carrier gases) can be provided to the chamber interior from a gas supply 150 and an annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, the separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutrals (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 3:
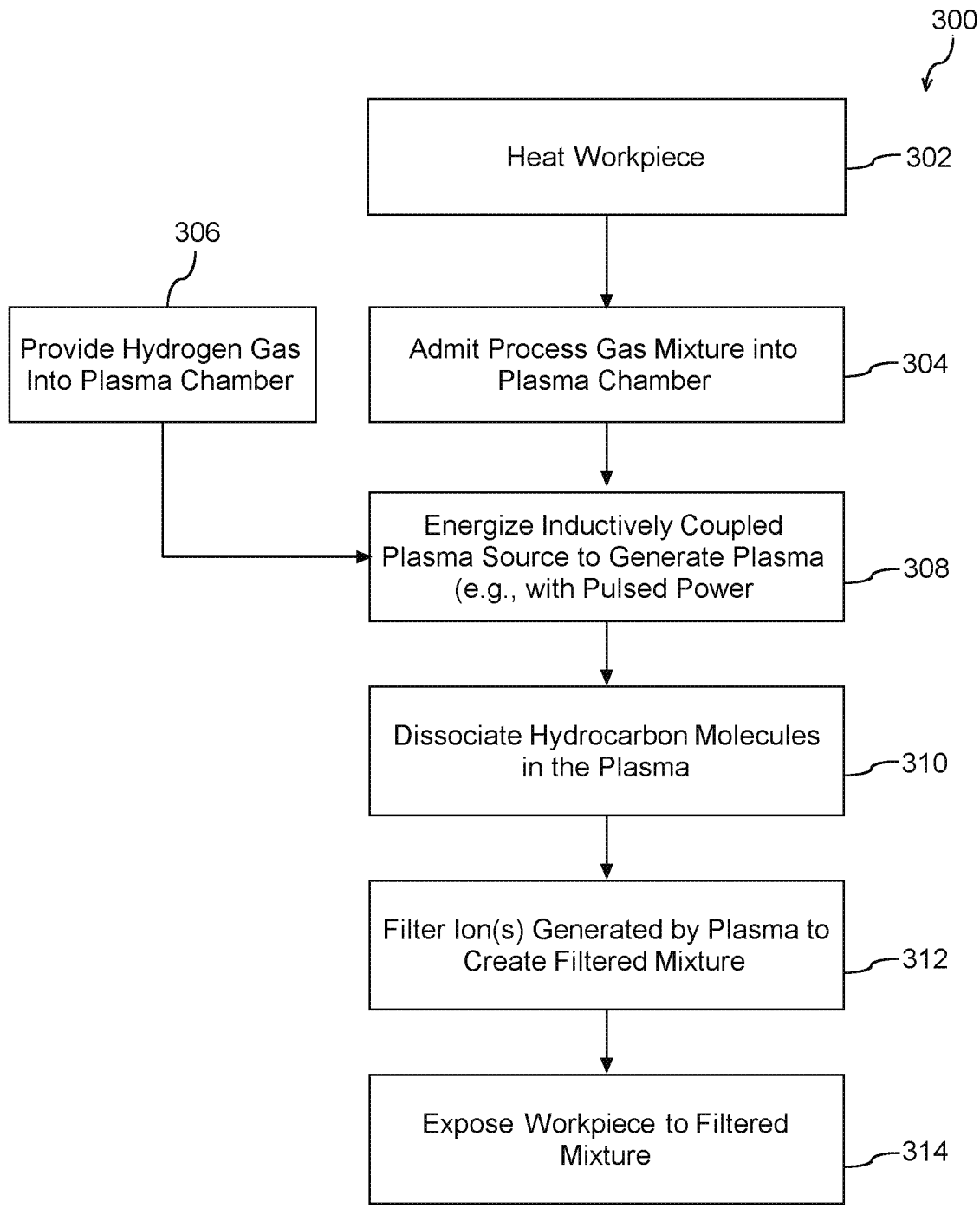
FIG. 3 depicts a flow diagram of an example surface treatment process according to example embodiments of the present disclosure.

FIG. 3 depicts a flow diagram of an example organic radical based surface treatment process (300) according to example aspects of the present disclosure. The organic radical based surface treatment process (300) can be implemented using the plasma processing apparatus 100. However, as will be discussed in detail below, the organic radical based surface treatment processes according to example aspects of the present disclosure can be implemented using other approaches without deviating from the scope of the present disclosure. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the organic radical based surface treatment process can include heating a workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 20° C. to about 400° C.

At (304), the surface treatment process can include admitting a process gas into the plasma chamber. For instance, a process gas can be admitted into the plasma chamber interior 125 from the gas source 150 via the annular gas distribution channel 151 or other suitable gas introduction mechanism.

In some embodiments, the process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_5H_{10}$, 1,3,5-trimethyl-cyclohexane $C_9H_{18}$, etc. In some embodiments, the hydrocarbon precursors can include alkenes $CH_2$, where n is greater than or equal to two and less than or equal to ten, such as ethylene $C_2H_4$, propene $C_3H_6$, etc.

At (306), the surface treatment process can include (e.g., optionally include) admitting a second gas into the plasma chamber, such as a reactive gas, such as hydrogen gas ($H_2$). For instance, the second gas can be admitted into the plasma chamber as part of a process gas. The process gas can include a mixture including $H_2$ and $N_2$ and/or a mixture including $H_2$ and He and/or a mixture including $H_2$ and Ar. In some embodiments, the process gas is an inert gas, such as helium, argon, or xenon.

At (308), the surface treatment process can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired radicals with reduced plasma energy. The plasma can be used to generate one or more hydrogen radicals from the hydrogen gas.

At (310), the surface treatment process can include dissociating one or more hydrocarbon molecules in the mixture in the plasma chamber interior using the plasma. For instance, a plasma induced in the plasma chamber interior 125 using the inductively coupled plasma source 135 can dissociate hydrocarbon molecules and other molecules in the process gas to generate radicals and ions. For instance, the one or more hydrocarbon molecules can be dissociated in the plasma to generate organic radicals, such as $CH_3$ radicals.

At (312), the surface treatment process can include filtering one or more ions generated by the plasma in the mixture to create a filtered mixture. The filtered mixture can include radicals generated by dissociation of the hydrocarbon molecules, such as $CH_3$ radicals.

In some embodiments, the one or more ions can be filtered using a separation grid assembly separating the plasma chamber from a processing chamber where the workpiece is located. For instance, the separation grid 200 can be used to filter ions generated by the plasma. The separation grid 200 can have a plurality of holes. Charged particles (e.g., ions) can recombine on the walls in their path through the plurality of holes. Neutrals (e.g., radicals such as $CH_3$ radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

Figure 4:
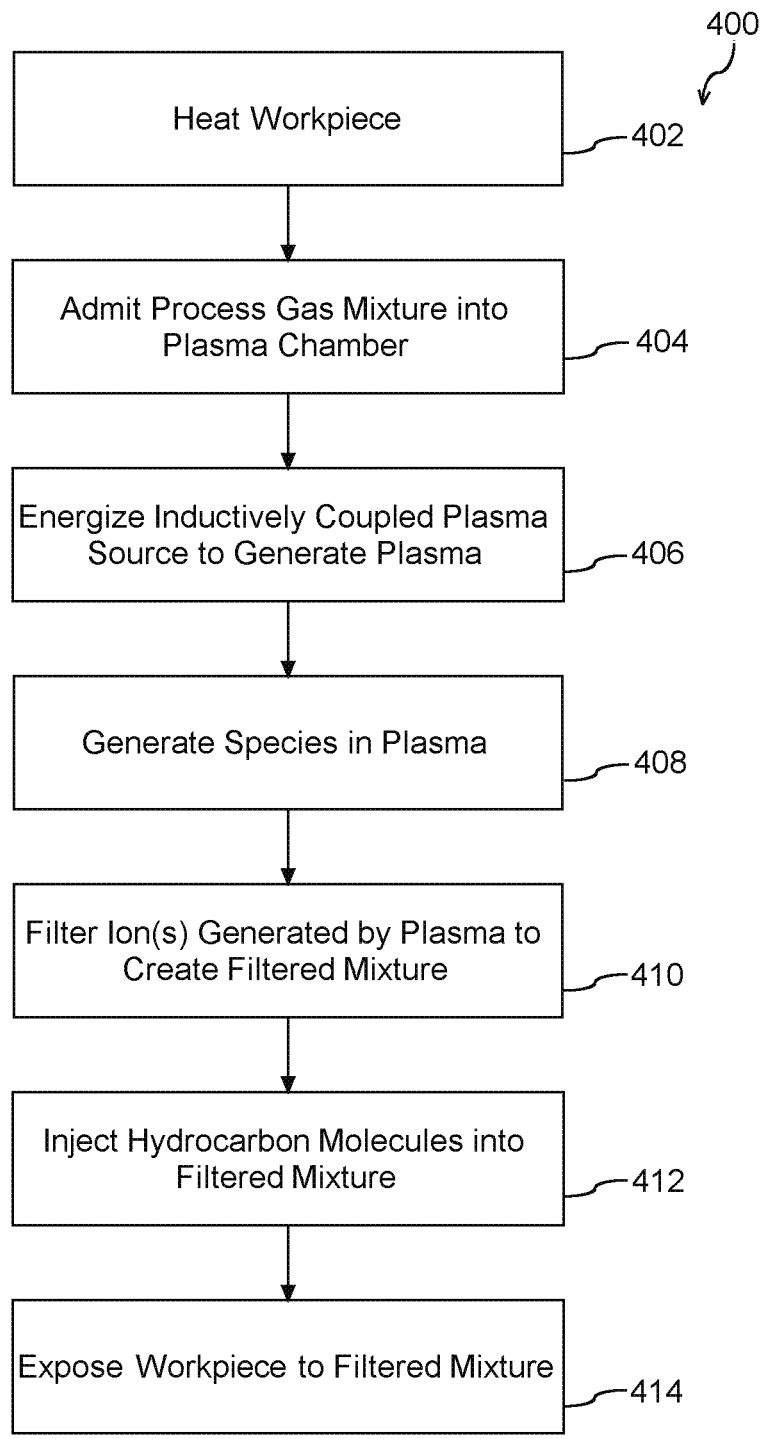
FIG. 4 depicts a flow diagram of an example surface treatment process according to example embodiments of the present disclosure.

At (314) of FIG. 4, the surface treatment process can include exposing the carbon containing layer to the filtered mixture. More particularly, the workpiece can be exposed to radicals (e.g., $CH_3$ radicals) generated in the plasma and passing through the separation grid assembly. As an example, organic radicals (e.g., $CH_3$ radicals) can pass through the separation grid 200 and can be exposed on the workpiece 114. In some embodiments, exposing the workpiece to organic radicals can result in attachment of organic radicals on at least a portion of the carbon containing layer.

The organic radical based surface treatment process can be implemented using other approaches without deviating from the scope of the present disclosure. For instance, in some embodiments, the organic radicals can be generated at least in part using post plasma gas injection.

For example, FIG. 4 depicts a flow diagram of an example surface treatment process (400) where organic radicals are generated using post plasma gas injection according to example embodiments of the present disclosure. The process (400) will be discussed with reference to the plasma processing apparatus 100 of FIG. 2 by way of example. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the surface treatment process can include heating a workpiece. For instance, the workpiece 114 can be heated in the processing chamber to a process temperature. The workpiece 114 can be heated, for instance, using one or more heating systems associated with the pedestal 112. In some embodiments, the workpiece can be heated to a temperature in the range of about 50° C. to about 400° C.

At (404), the surface treatment process can include admitting a process gas mixture into a plasma chamber. For instance, a process gas can be admitted into the plasma chamber interior 125 from the gas source 150 via the annular gas distribution channel 151 or other suitable gas introduction mechanism. In some embodiments, the process gas can include a reactive gas, such as hydrogen gas ($H_2$). The process gas can include a carrier gas such as $N_2$ and/or He and/or Ar. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas can be an inert gas. For instance, the process gas can be an inert gas with no reactive gas. In particular embodiments, the process gas can be helium, xenon, argon, or other inert gas.

At (406), the surface treatment process can include energizing an inductively coupled plasma source to generate a plasma in a plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired species with reduced plasma energy.

At (408), the surface treatment process can include dissociating one or more molecules in the mixture in the plasma chamber interior using the plasma. For instance, a plasma induced in the plasma chamber interior 125 from a reactive process gas (e.g., $H_2$) using the inductively coupled plasma source 135 can dissociate molecules in the process gas mixture to generate radicals (e.g. H radicals) and ions. As another example, a plasma induced in the plasma chamber interior 125 from an inert process gas (e.g., He) using the inductively coupled plasma source 135 can generate one or more excited inert gas molecules (e.g., excited He molecules).

At (410), the surface treatment process can include generating one or more species in the plasma from the process gas. The filtered mixture can include species generated in the plasma from the process gas.

In some embodiments, the one or more ions can be filtered using a separation grid assembly separating the plasma chamber from the processing chamber where the workpiece is located. For instance, the separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (412), the process can include injecting hydrocarbon molecules into the filtered mixture post filtering. The hydrocarbon molecules can react with hydrogen radical to generate desired radicals (e.g., $CH_3$ radicals).

Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $CH_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

Figure 5:
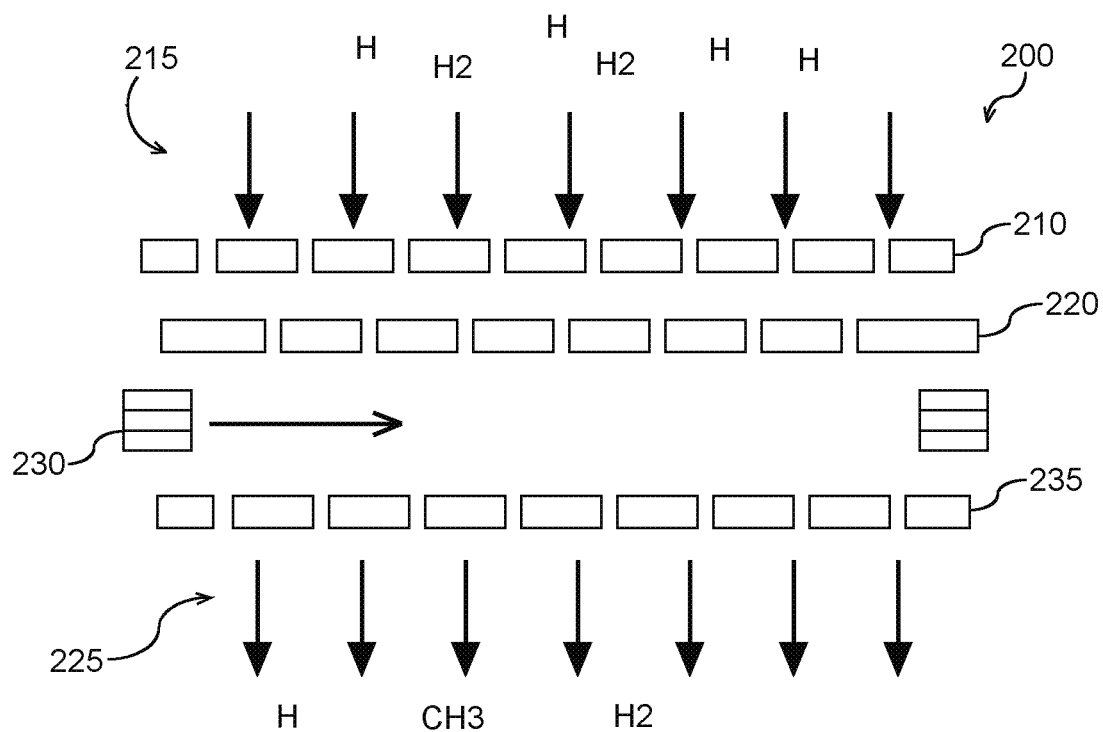
FIG. 5 depicts example post plasma gas injection during a surface treatment process according to example embodiments of the present disclosure.

FIG. 5 depicts an example separation grid 200 for injection of hydrocarbon molecules post ion filtering according to example embodiments of the present disclosure. More particularly, the separation grid 200 includes a first grid plate 210 and a second grid plate 220 disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Neutral and charged particles 215 from the plasma can be exposed to the separation grid 200. Charged particles (e.g., ions) can recombine on the walls in their path through the holes of each grid plate 210, 220 in the separation grid 200. Neutral species (e.g., H radicals or excited inert gas molecules) can flow relatively freely through the holes in the first grid plate 210 and the second grid plate 220.

Subsequent to the second grid plate 220, a gas injection source 230 can be configured to admit hydrocarbon gas into the filtered mixture. Radicals (e.g., $CH_3$ radicals) 225 resulting from the injection of hydrocarbon gas can pass through a third grid plate 235 for exposure to the workpiece.

The present example is discussed with reference to a separation grid with three grid plates for example purposes. Those of ordinary skill in the art, using the disclosures provided herein, will understand that more or fewer grid plates can be used without deviating from the scope of the present disclosure.

At (414) of FIG. 4, the surface treatment process can include exposing the carbon containing layer to the filtered mixture. More particularly, the workpiece with the carbon containing layer can be exposed to radicals (e.g., $CH_3$ radicals) after injection of the hydrocarbon molecules. As an example, radicals (e.g., $CH_3$ radicals) can pass through the third grid plate 235 (FIG. 5) and can be exposed on the workpiece 114. In some embodiments, exposing the workpiece to organic radicals can result in methylation of at least a portion of the carbon containing layer.

Figure 6:
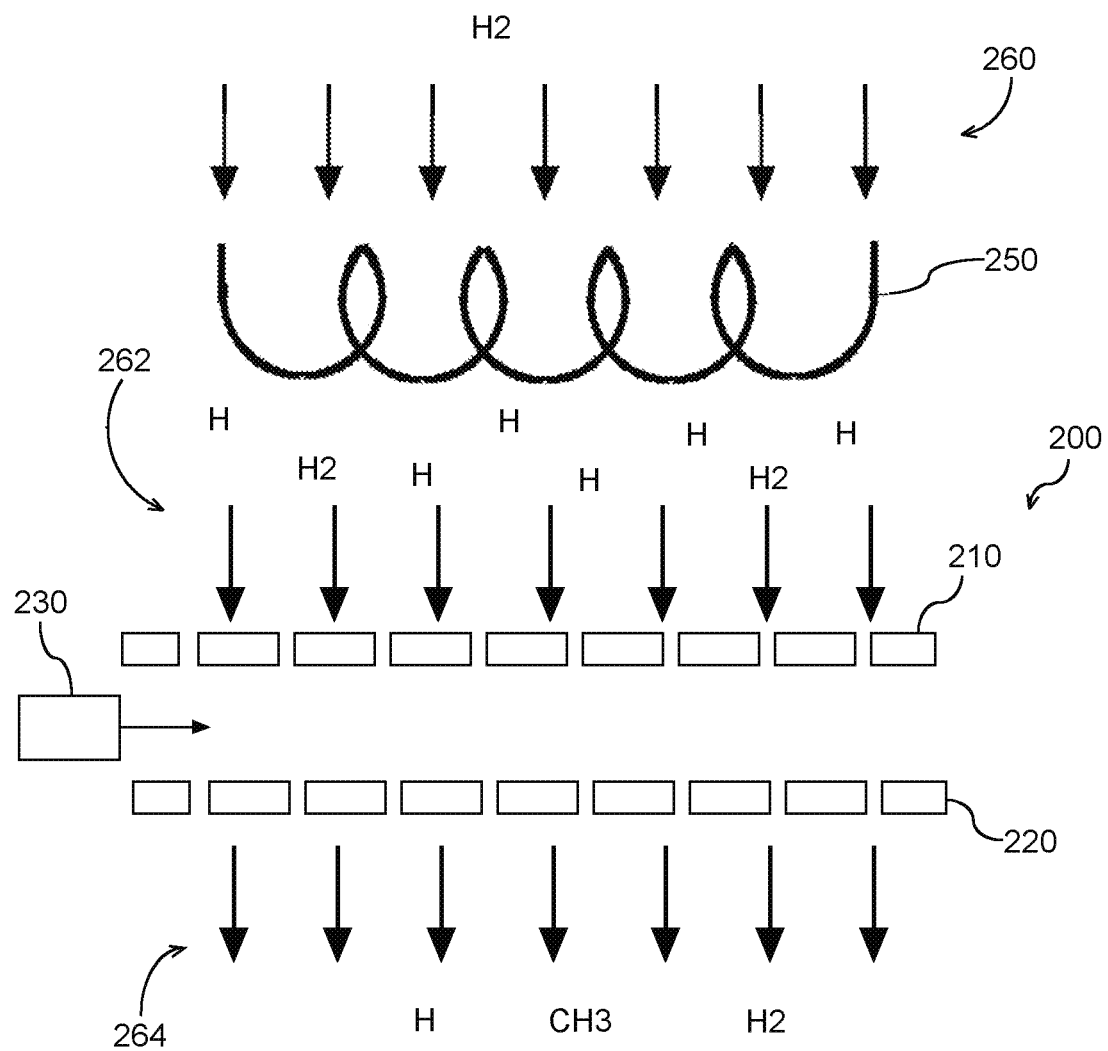
FIG. 6 depicts an example source of hydrogen radicals according to example embodiments of the present disclosure.

In some embodiments, the hydrogen radicals can be generated using a different source of hydrogen radicals. For instance, as shown in FIG. 6, a hydrogen gas $H_2$ can be passed over a heated filament (e.g., a tungsten filament) to generate hydrogen radicals in a first chamber. The hydrogen radicals can be passed through the separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

Subsequent to the first grid plate 210, a gas injection source 230 can be configured to admit hydrocarbon gas into the filtered mixture. The radicals (e.g., $CH_3$ radicals) 225 resulting from the injection of hydrocarbon gas can pass through a second grid plate 220 for exposure to the workpiece.

The hydrocarbon gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $CH_2In$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9His$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

The present example is discussed with reference to a separation grid with two grid plates for example purposes. Those of ordinary skill in the art, using the disclosures provided herein, will understand that more or fewer grid plates can be used without deviating from the scope of the present disclosure.

The organic radicals (e.g., $CH_3$ radicals) can be generated using other approaches with deviating from the scope of the present disclosure. As one example, organic radicals (e.g., $CH_3$ radicals) can be generated using pyrolysis (thermal decomposition) of molecules (e.g., azomethane $CH_3$—N=N—$CH_3$). As another example, organic radicals can be generated or UV-assisted molecule dissociation (e.g., acetone $CH_3COCH_3$).

Figure 7:
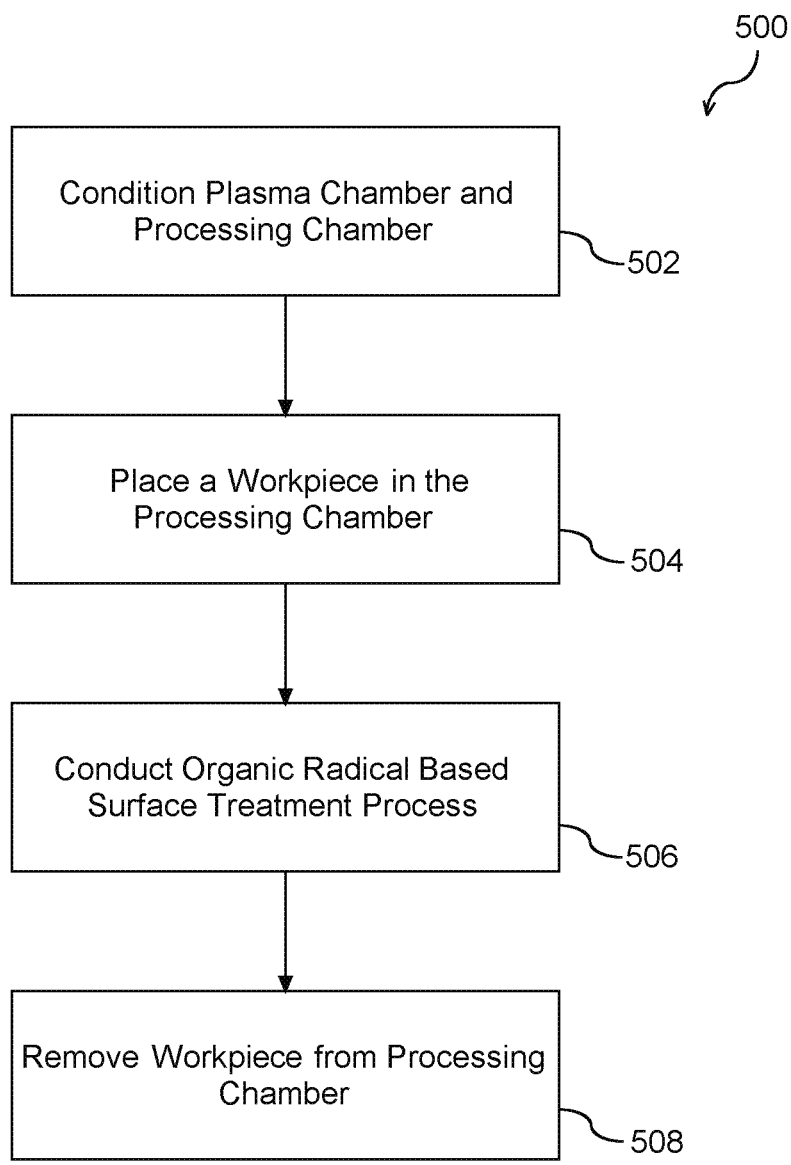
FIG. 7 depicts a flow diagram of an example method according to example embodiments of the present disclosure.

FIG. 7 depicts a flow diagram of one example method (500) for semiconductor device fabrication according to example aspects of the present disclosure. The method (500) will be discussed with reference to the plasma processing apparatus 100 of FIG. 2 by way of example. The method (500) can be implemented in any suitable processing apparatus having a first chamber separated from a second chamber, for instance, by a separation grid. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the method can include conditioning a processing apparatus for conducting an organic radical based surface treatment process according to example embodiments of the present disclosure. For instance, the method can include conditioning the plasma chamber 120 and/or the processing chamber 110 for conducting a surface treatment process. In some embodiments, conditioning the plasma processing apparatus 100 can include generating an oxygen-based plasma in the plasma chamber 120 before introduction of a workpiece into the processing chamber 110. Other oxidation-based chemistry processes can be performed to condition the plasma processing apparatus without deviating from the scope of the present disclosure.

At (504), the method can include placing a workpiece in a processing chamber of the plasma processing apparatus. The workpiece can include a carbon containing layer, such as photoresist. The processing chamber can be separated from a plasma chamber (e.g., separated by a separation grid assembly). For instance, the method can include placing the workpiece 114 onto the pedestal 112 in the processing chamber 110.

Referring to FIG. 7, the method can include performing an organic radical based surface treatment process (506) according to example aspects of the present disclosure. The organic radical based surface treatment process can be any organic radical based surface treatment process disclosed herein. For instance, the organic radical based surface treatment process can be the example surface treatment process(s) discussed with reference to FIGS. 4-7. The organic radical based surface treatment process can be used, for instance, to modify properties of the carbon-containing layer as a process parameter for a dry strip process.

In some embodiments, the organic radical based surface treatment process can be performed at the same time as a dry strip process as a single step. For instance, in this example embodiment, the plasma source 135 can be used to generate one or more hydrogen radicals from a process gas in the plasma chamber 120. The process gas can include, for instance, a mixture of $H_2$ and $N_2$ and/or a mixture of $H_2$ and He and/or a mixture of $H_2$ and Ar. The plasma source 135 can also be used to dissociate one or more hydrocarbon molecules to generate organic radicals (e.g., $CH_3$ radicals) as part of the same process step. The radicals (e.g., including $CH_3$ radicals) can pass through a separation grid 200 to a processing chamber for exposure to the workpiece 110. The radicals can be used, for instance, for removal of a photoresist, residue, or other material. The $CH_3$ radicals can form a protective layer on Si and/or SiGe surfaces on the workpiece to reduce material loss of the Si and/or SiGe surfaces during the dry strip process.

Figure 8:
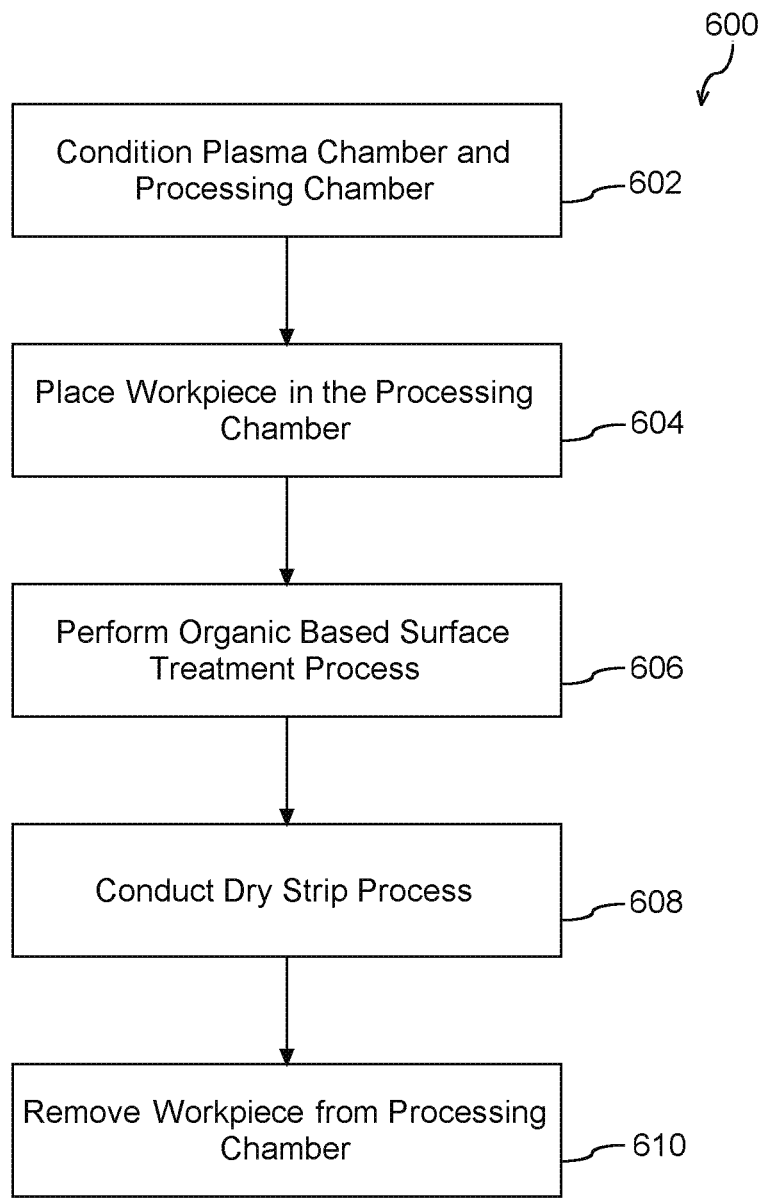
FIG. 8 depicts a flow diagram of an example method according to example embodiments of the present disclosure.

At (508) of FIG. 8, the method can include removing the workpiece from the processing chamber. For instance, the workpiece 114 can be removed from the pedestal 112 in the processing chamber 110. The plasma processing apparatus can then be conditioned for future processing of additional workpieces.

FIG. 8 depicts a flow diagram of one example method (600) for semiconductor device fabrication according to example aspects of the present disclosure. The method (600) will be discussed with reference to the plasma processing apparatus 100 of FIG. 2 by way of example. The method (600) can be implemented in any suitable processing apparatus having a first chamber separated from a second chamber, for instance, by a separation grid. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (602), the method can include conditioning a processing apparatus for conducting an organic radical based surface treatment process according to example embodiments of the present disclosure. For instance, the method can include conditioning the plasma chamber 120 and/or the processing chamber 110 for conducting a surface treatment process. In some embodiments, conditioning the plasma processing apparatus 100 can include generating an oxygen-based plasma in the plasma chamber 120 before introduction of a workpiece into the processing chamber 110. Other oxidation-based chemistry processes can be performed to condition the plasma processing apparatus without deviating from the scope of the present disclosure.

At (604), the method can include placing a workpiece in a processing chamber of the plasma processing apparatus. The workpiece can include a carbon containing layer, such as photoresist. The processing chamber can be separated from a plasma chamber (e.g., separated by a separation grid assembly). For instance, the method can include placing the workpiece 114 onto the pedestal 112 in the processing chamber 110.

At (606), the method can include performing an organic radical based surface treatment process according to example aspects of the present disclosure. The organic radical based surface treatment process can be any organic radical based surface treatment process disclosed herein. For instance, the organic radical based surface treatment process can be the example surface treatment process(s) discussed with reference to FIGS. 3-6. The organic radical based surface treatment process can be used, for instance, to modify properties of the carbon-containing layer as a process parameter for a dry strip process. The organic radical based surface treatment process can be a methyl radical based process resulting in methylation of at least a portion of a surface of the carbon containing layer.

At (608), the method can include performing a dry strip process. The dry strip process can be performed as a separate step relative to the organic radical based surface treatment process. The dry strip process can include inducing a plasma in a process gas in the plasma chamber 120 using the inductively coupled plasma source 135 to generate one or more ions and radicals. The process gas can be, for instance, a mixture having $H_2$ and $N_2$ and/or a mixture having $H_2$ and He and/or a mixture having $H_2$ and Ar. The ions and radicals can be provided to a separation grid. The separation grid can filter one or more ions and allow the radicals to pass through the separation grid to a processing chamber for exposure to the workpiece. The radicals can be used, for instance, for photoresist removal or other dry strip process.

At (610) of FIG. 8, the method can include removing the workpiece from the processing chamber. For instance, the workpiece 114 can be removed from the pedestal 112 in the processing chamber 110. The plasma processing apparatus can then be conditioned for future processing of additional workpieces.

Figure 9:
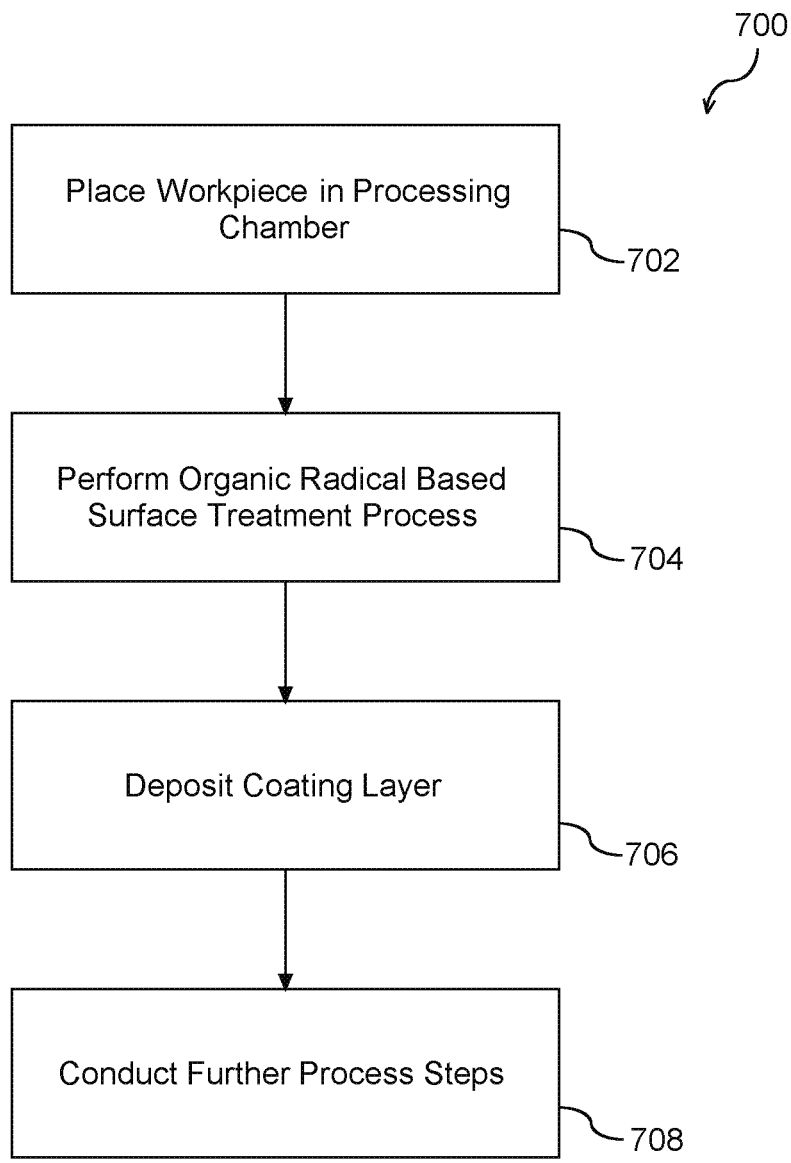
FIG. 9 depicts a flow diagram of an example method according to example embodiments of the present disclosure.

FIG. 9 depicts a flow diagram of one example method (700) for semiconductor device fabrication according to example aspects of the present disclosure. The method (700) will be discussed with reference to the plasma processing apparatus 100 of FIG. 2 by way of example. The method (700) can be implemented in any suitable processing apparatus having a first chamber separated from a second chamber, for instance, by a separation grid. FIG. 9 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece in a processing chamber of a plasma processing apparatus. The workpiece can include one or more hydrophilic workpiece layers. The hydrophilic layers can include, for instance, Si, SiGe, SiN, $SiO_2$, $Al_2O$, TaN, TiN, W, and/or Cu. The processing chamber can be separated from a plasma chamber (e.g., separated by a separation grid assembly). For instance, the method can include placing a workpiece 114 onto pedestal 112 in the processing chamber 110.

At (704), the method can include performing an organic radical based surface treatment process according to example aspects of the present disclosure. The organic radical based surface treatment process can be any organic radical based surface treatment process disclosed herein. For instance, the organic radical based surface treatment process can be the example surface treatment process(es) discussed with reference to FIGS. 3-6.

The organic radical based surface treatment process can be used, for instance, to modify a surface wetting angle of the hydrophilic workpiece layer. The organic radical based surface treatment process can be a methyl radical based process resulting in methylation of at least a portion of a surface of the carbon containing layer. The attachment of methyl radicals to the surface of the hydrophilic workpiece layer can make the workpiece layer more hydrophobic, facilitating the coating and/or deposition of other layers (e.g., photoresist, antireflective coating layers, etc.) onto the workpiece.

At (706), the method can include depositing a coating layer onto a workpiece layer on the workpiece. For instance, a photoresist layer can be deposited onto the workpiece layer. As another example, an antireflective coating layer can be deposited onto the workpiece layer.

At (708) of FIG. 9, the method can include performing further process steps, such as semiconductor fabrication process steps. As one example, the method can include performing a photolithography process to form a pattern on a surface of the workpiece. The method can include performing a dry strip process for photoresist removal or other residue removal. The method can include performing a wet clean process or other semiconductor fabrication process steps.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a semiconductor material and a carbon containing layer, the method comprising performing a surface treatment process on the carbon containing layer, the surface treatment process comprising:
    generating one or more species using a plasma induced in a first chamber;
    filtering the one or more species generated by the plasma to create a first mixture;
    injecting one or more hydrocarbon molecules into the first mixture post filtering to create a second mixture, the second mixture comprising one or more organic radicals; and
    exposing the carbon containing layer to the second mixture in a second chamber.

2. The method of claim 1, wherein the one or more hydrocarbon molecules have a chemical formula of $C_nH_{2n+2}$, where n is greater than or equal to 1 and less than or equal to 10.

3. The method of claim 1, wherein the one or more hydrocarbon molecules have a chemical formula of $C_nH_{2n}$, where n is greater than or equal to 2 and n is less than or equal to 10.

4. The method of claim 1, wherein the one or more organic radicals are generated by dissociating one or more hydrocarbon molecules in the second mixture in the first chamber.

5. The method of claim 1, wherein the first chamber is separated from the second chamber with a separation grid, and wherein the hydrocarbon molecules are mixed with the species in the second chamber.

6. The method of claim 1, wherein the second mixture comprises one or more organic radicals.

7. The method of claim 1, wherein the second mixture comprises a $CH_3$; radical.

8. The method of claim 1, wherein the carbon containing layer comprises photoresist.

9. The method of claim 1, wherein the method comprises performing a dry strip process to remove at least a portion of the carbon containing layer.

10. The method of claim 1, wherein the one or more species are generated try the plasma induced in a process gas in the first chamber.

11. The method of claim 10, wherein the process gas is an inert gas.

12. The method of claim 11, wherein the inert gas is helium.

13. The method of claim 10, wherein the process gas comprises a hydrogen gas and the species comprise hydrogen radicals.

14. The method of claim 10, wherein the one or more organic radicals are generated in the plasma in the first chamber using an inductively coupled plasma source.

15. The method of claim 10, wherein the method comprises filtering one or more ions to create the first mixture using a separation grid separating first chamber from the second chamber.

16. The method of claim 1, wherein the one or more species comprise hydrogen radicals generated using a heated filament.

17. The method of claim 1, wherein the one or more organic radicals are generated using pyrolysis of molecules or UV-assisted molecule dissociation.

\* \* \* \* \*